United States Patent [19]
Mielke et al.

[11] Patent Number: 5,898,628
[45] Date of Patent: Apr. 27, 1999

[54] DATA TRANSFER CIRCUIT

[75] Inventors: Bruce Mielke, Los Altos Hills; Matthew C. Hendricks, Palo Alto, both of Calif.

[73] Assignee: Altera Corporation, San Jose, Calif.

[21] Appl. No.: 08/842,903

[22] Filed: Apr. 17, 1997

Related U.S. Application Data

[60] Provisional application No. 60/016,239, Apr. 19, 1996.

[51] Int. Cl.$^6$ ...................................................... G11C 7/00
[52] U.S. Cl. .............. 365/201; 365/189.02; 365/189.12; 365/240
[58] Field of Search .............................. 365/201, 189.12, 365/240, 239, 230.02, 221, 189.02

[56] References Cited

U.S. PATENT DOCUMENTS

| | | | |
|---|---|---|---|
| 4,833,655 | 5/1989 | Wolf et al. | 365/221 |
| 5,400,343 | 3/1995 | Crittenden et al. | 365/201 X |
| 5,630,091 | 5/1997 | Lin et al. | 365/189.12 |

*Primary Examiner*—Huan Hoang
*Attorney, Agent, or Firm*—Townsend and Townsend and Crew LLP

[57] ABSTRACT

A method and apparatus for maximizing the data transmission rate from a source data path to selected channels of a destination data path having a different width from the source data path. In a preferred embodiment, the data transfer circuit includes at least one transfer register that is typically of the same width as the data source. Each bit from the transfer register is input to a plurality of multiplexers, each of which typically selects a single bit and outputs the selected bit to the destination.

24 Claims, 5 Drawing Sheets

DATA TRANSFER CIRCUIT

CROSS-REFERENCE TO RELATED APPLICATION

This application claims priority from Provisional Application Ser. No. 60/016,239, filed Apr. 19, 1996, which is hereby incorporated by reference.

BACKGROUND OF THE INVENTION

The present invention relates generally to data transfer circuits. Specifically, a method and apparatus are provided for maximizing the data transmission rate from a source data path to selected channels of a destination data path having a different width from the source data path.

Inefficiencies naturally occur when data from a source of one width is transmitted to a destination of a different width. If the data destination has a narrower width than the data source, each data cycle transmitting the data from the source to the destination will waste bits. Looking at circuit configuration 100 in FIG. 1, for example, the width of data source 102 is 16 bits, while the width of destination 104 is 4 bits. In a typical application, data source 102 and destination 104 may be registers for storing data. Thus, only 4 bits will be transmitted in one data cycle from source to destination, meaning that 12 bits are wasted, assuming that data bus 106 has a total capacity of 16 bits. A complete transfer of data from source 102 to destination 104 will therefore require four data cycles on bus 106, which is very inefficient since it requires four transmissions to the same destination.

Similarly, when the data destination is wider than the data source, the destination is typically mapped into multiple ports (addresses), with the data being sent in multiple cycles to the different ports, again resulting in wasted bits in each data transmission. Looking at the circuit configuration 200 in FIG. 2, for example, the width of data source 202 is 16 bits, while the width of each destination 204 and 206 is also 16 bits. However, the first destination address 204 requires only 8 bits of source data and the second destination address 206 also requires 8 bits of source data. Thus, the first data cycle transmits 8 bits of data from source 202 to the first destination address 204, wasting 8 bits of source data that could have been transmitted across 16-bit wide data bus 208. The second data cycle then transmits another 8 bits of data from source 202 to the second destination 206, again wasting 8 bits of source data that could have been transmitted on data bus 208. Thus, two data cycles are needed for the entire data transmission, though data bus 208 could have handled the contents of the entire data source 202 in only one data cycle.

The problem described above is of particular concern when testing integrated circuit chips. Integrated circuit chips customarily undergo exhaustive testing during the manufacture process prior to encapsulation in a package or use of the package on a circuit board in order to ensure reliable operation of the chip. The chip die undergoes functional and parametric testing in at least two different stages of the manufacturing process. At one stage, a semiconductor wafer containing multiple chip dies is probed by a probe tester that tests each of the dies individually. At another stage, after an individual chip die has been encapsulated in a package, a programmable package tester can be used to thoroughly test the integrated circuit chip package.

In a preferred digital test system, testing is controlled by a control unit, which may be, for example, a central processing unit (CPu) or a dedicated block of control logic. These test systems generally include a data source, usually a memory space divided into separate tester channels, for storing state information for each pin of the integrated circuit chip. The stored DUT input and output states are commonly referred to as test vectors. In order to perform a functional test of the device, the device tester, under control of appropriate test software, applies excitations to and receives responses from the device under test (DUT) under control of the tester. More specifically, the control unit transfers test vector data from the data source through the tester channels to a destination, the DUT pins. The control unit also transfers the test vector data from the data source to a comparator, where each resultant output state of the DUT is compared to an expected value by the tester. If the actual and expected values correspond, the chip has passed the test.

For example, the integrated circuit chip may be a programmable logic device (PLD), which is a programmable integrated circuit that allows the user of the circuit, using software control, to customize the logic functions the circuit will perform. In this example, a first group of test vectors is used to initialize the PLD in a desired logic configuration, and a second group of test vectors is then used to exercise the configured PLD. Again, the observed result is then compared with an expected result to see if the PLD is functioning properly.

In such test systems, the speed with which the control unit can move data from the data source to the DUT and comparators is of primary importance. The faster the control unit can move the data, the greater the resultant test vector rate. An exemplary alternate method of increasing the test vector rate is described in related application Ser. No. 08/790,693, entitled "METHOD AND APPARATUS OF INCREASING THE VECTOR RATE OF A DIGITAL TEST SYSTEM," also assigned to the assignee of the present application and incorporated by reference herein. Therefore, the inefficient transmission of data from a source of one width to a destination of a different width described above seriously impairs the speed with which the control unit can execute a test program. The multiple data cycles required to transfer data from source to destination slow down the test program and lengthen the testing process.

Therefore, a new testing method and apparatus are desired to maximize the data transmission rate from a source data path to selected channels of a destination data path having a different width from the source data path, especially in the context of an integrated circuit chip test system.

SUMMARY OF THE INVENTION

The present invention provides a method and apparatus for maximizing the data transmission rate from a source data path to selected channels of a destination data path having a different width from the source data path. In a preferred embodiment, the data transfer circuit of the present invention includes at least one data transfer register that is typically of the same width as the data source. Each bit from the transfer register is input to a plurality of multiplexers, each of which typically selects a single bit and outputs the selected bit to the destination. The invention allows a data transfer to be completed in a minimum number of source data cycles. A further understanding of the nature and advantages of the inventions herein may be realized by reference to the remaining portions of the specification and the attached drawings.

DESCRIPTION OF THE PREFERRED EMBODIMENT

Figure 1:
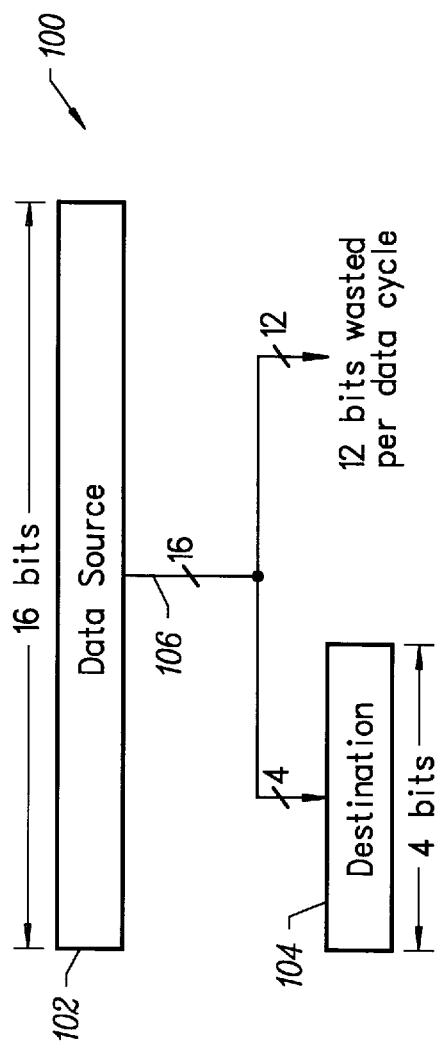
FIG. 1 shows a block diagram of a prior art data transfer circuit where the destination is narrower than the source.
Figure 2:
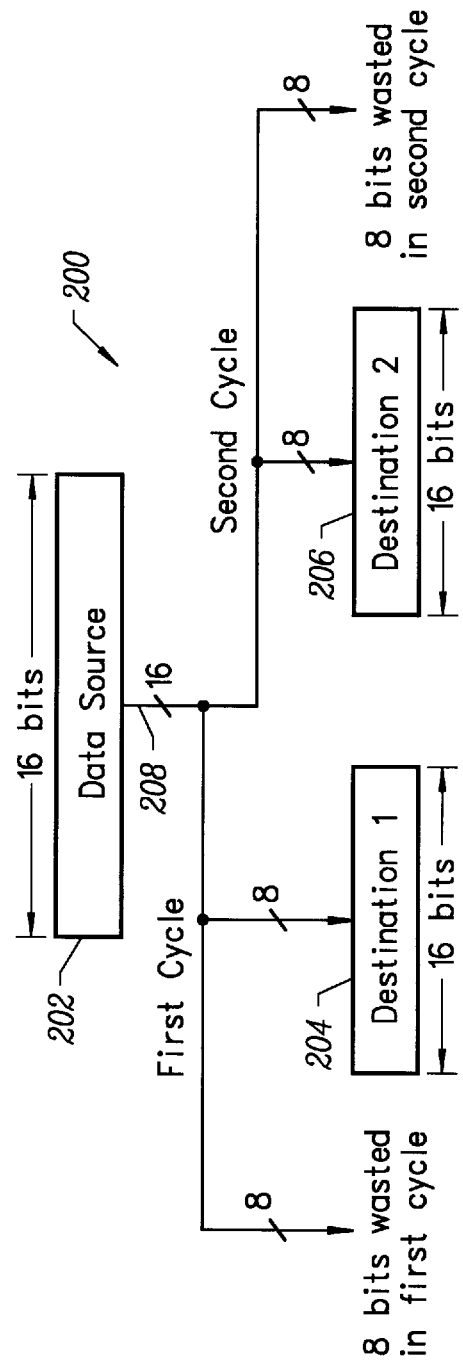
FIG. 2 shows a block diagram of a prior art data transfer circuit where the destination is wider than the source.
Figure 3:
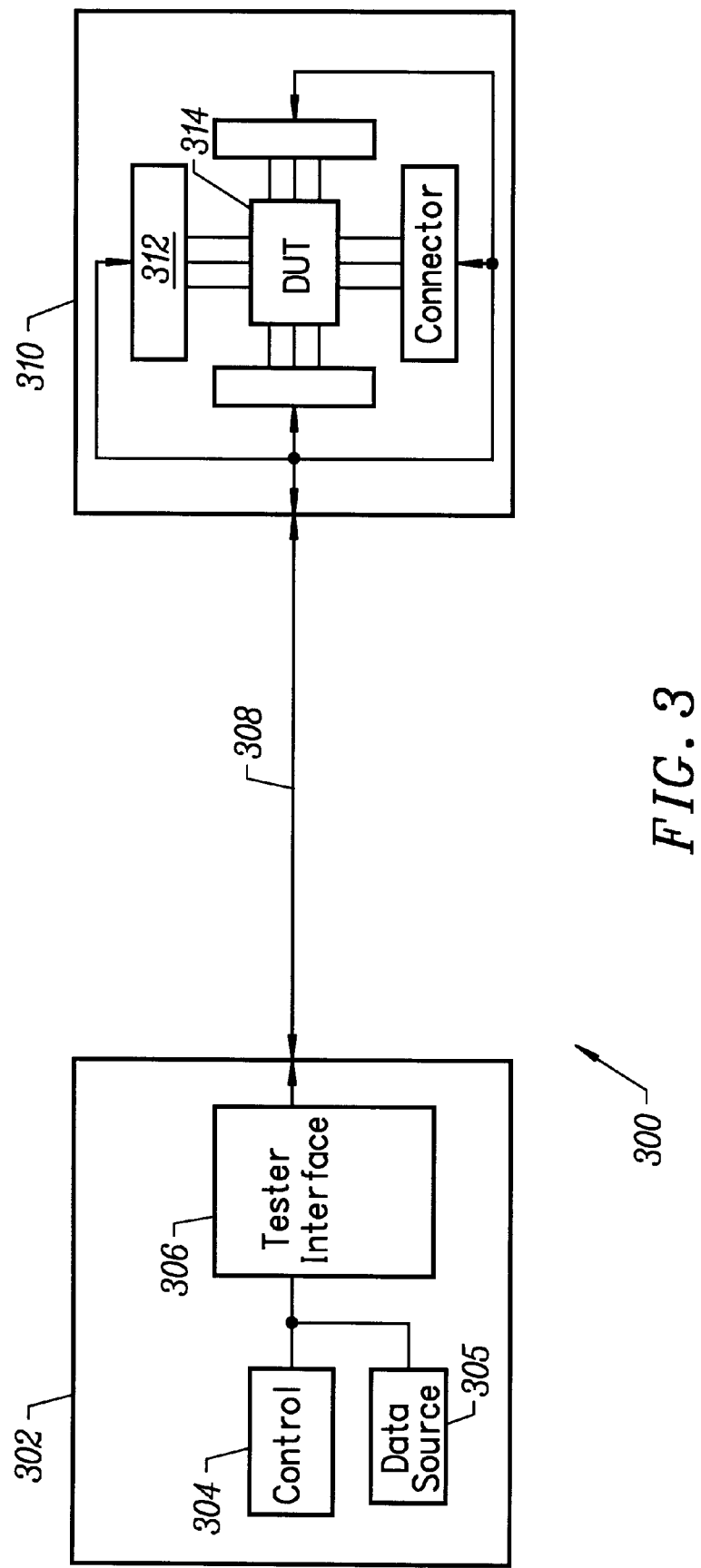
FIG. 3 shows a block diagram of a digital test system for an integrated circuit chip incorporating the present invention.

FIG. 3 shows a simplified block diagram of a general digital test system 300 for an integrated circuit chip. Tester 302 includes a control block 304, a data source 305 and a tester interface block 306. Control block 304 executes the instructions to control the testing process and may be, by way of example, a microprocessor or dedicated logic. Data source 305 is typically a memory. In a preferred embodiment, tester interface block 306 includes the data transfer circuit of the present invention (described in detail below) required to carry out testing on an integrated circuit chip by transmitting test data to the device under test. Tester 302 is coupled via bus 308 to test card 310. Test card 310 includes connectors 312 and device under test (DUT) 314. Connectors 312 are coupled to bus 308 and transfer test data between bus 308 and DUT 314 across hardwired connections to DUT 314.

Figure 4:
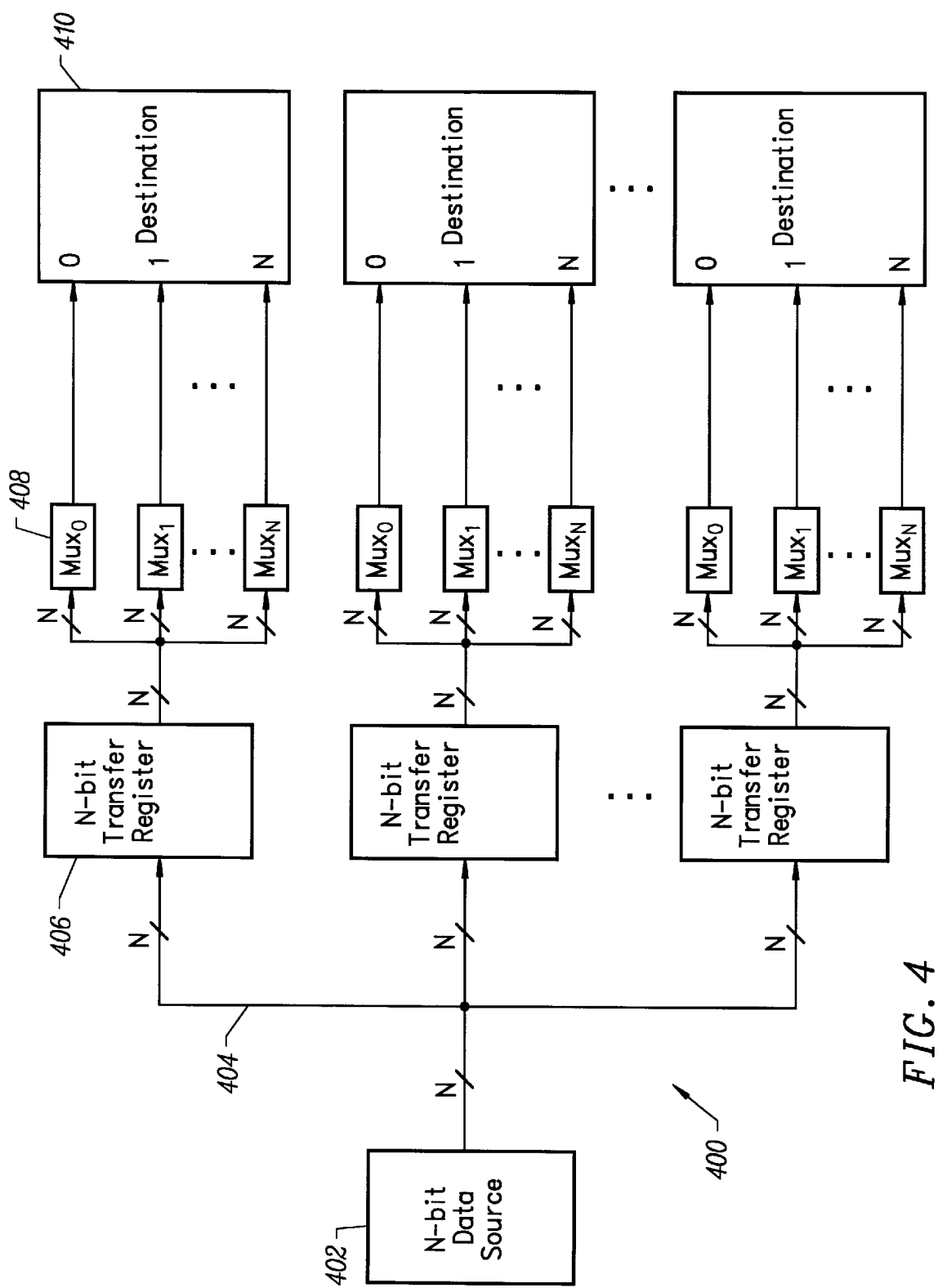
FIG. 4 shows a block diagram of a preferred embodiment of a data transfer circuit according to the present invention.

FIG. 4 shows a generalized block diagram of a data transfer circuit 400 according to the present invention. Data source 402 is N-bits wide. Referring to the exemplary test system application of FIG. 3, data source 402 is typically located in data source block 305 and is under control of control unit 304. Data source 402 would typically represent a register of N bits, but could in an alternate embodiment also refer to N bits on a data bus, such as a PCI bus. Data from data source 402, which might be a group of test vectors, for example, is transmitted over N-bit wide data bus 404 to one or more data transfer registers 406. In a preferred embodiment, transfer registers 406 are also N bits in width. However, it should be clear that each transfer register 406 does not need to be exactly the same width as data source 402. For example, as described earlier, there are applications where the destination is smaller than the source. In this case, the appropriate transfer register need only be as wide as the destination. The bits from each transfer register 406 are input to one or more multiplexers 408. For full generality, there will be N N×1 multiplexers 408 coupled to each N-bit transfer register 406, as shown. But, again, there does not need to be N multiplexers 408 for each transfer register 406 in every application. The output of each multiplexer 408 is coupled to a single bit in destination 410, where each destination 410 may be of differing widths. Referring again to the exemplary test system application of FIG. 3, destination 410 would typically represent signal pins (or pads) on DUT 314 or, alternatively, could be a register used to buffer data to DUT 314. The configuration shown in FIG. 4 permits all source data to be transferred from data source 402 to transfer registers 406 in a single source data cycle, irrespective of the width of destination 410.

Therefore, in operation, data source 402 will present data under the control of control unit 304, for example. Then, the data is transferred from data source 402 to transfer registers 406 in a parallel transfer operation. In one embodiment, the address of each transfer register 406 may be altered so that data may be loaded into any one or more of the transfer registers in any single source data cycle. The bits from each transfer register 406 are fed into multiplexers 408. Again, the multiplexers may be programmed so that each source data cycle is available to each multiplexer. Since a single cycle of source data may be loaded into any one or more transfer registers 406, and each destination bit may receive any of the source data bits through its associated multiplexer 408, each bit of source data may therefore be made available to any destination lines, in the case of full generality.

In an alternate embodiment, a parallel load shift register might be used as transfer register 406. In this case, since the bits in transfer registers 406 may be shifted to serialize the data output, any N-bit source data transfer to a destination of any width from 1 to N bits may be completed in a single source data cycle. As data is shifted through the bit positions in a transfer register 406, the data on the destination bit line coupled to the associated multiplexer 408 will change accordingly. If the shift frequency is set appropriately, all bits may be shifted out of register 406 between source data cycles. Alternatively, in the case of full generality, where each multiplexer 408 receives all N data bits from register 406, the selection of the data output of the appropriate multiplexer 408 may be rotated such that the destination bit line of interest receives all N bits from its associated multiplexer 408.

In some cases, it will be important to maintain the previous data state of destination bit lines not involved in a particular data transfer. In this instance, latches may be coupled to the outputs of multiplexers 408 to maintain the selected data bits in their existing states. Alternatively, inhibiting signals may be applied to selected destination bit lines to prevent one or more from changing regardless of the value of the source data inputs. Fewer than N bits at a time may be set in this fashion.

Figure 5:
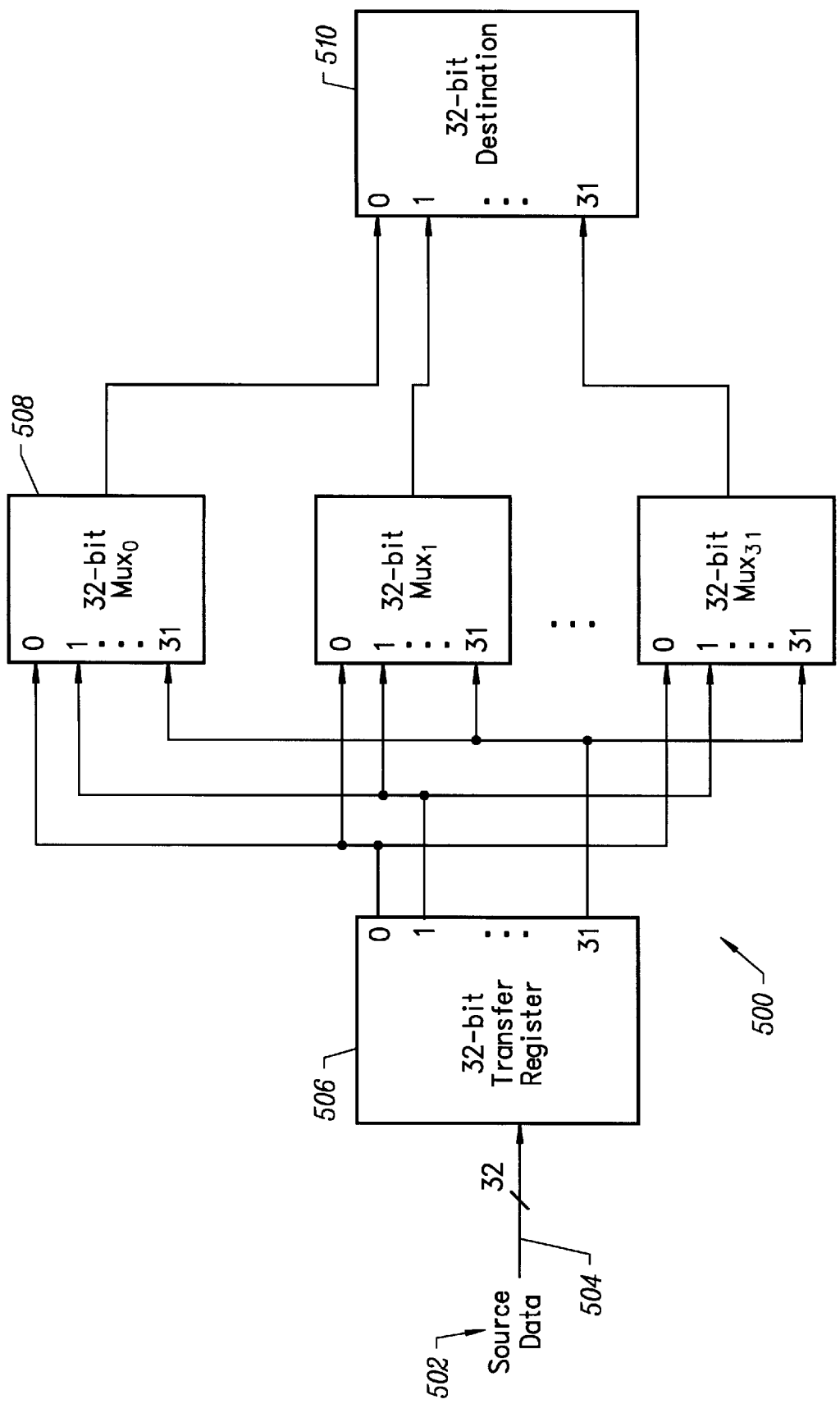
FIG. 5 shows further detail of a preferred embodiment of a data transfer circuit according to the present invention.

FIG. 5 shows further detail of an exemplary embodiment of a 32-bit data transfer circuit 500 according to the present invention. Source data 502 is input on 32-bit data bus 504 to a 32-bit transfer register 506. Only one transfer register 506 is shown, but, as noted in FIG. 4, a plurality of 32-bit registers 506 may simultaneously receive data from source 502. As full generality is depicted in this embodiment, each data bit from transfer register 506 is input to each of the 32 32×1 multiplexers 508. Accordingly, each source data bit may be input to any of the bit positions in destination 510. Also, as described above, in an alternate embodiment, by shifting the bits through transfer register 506, or alternatively, by changing the selected output bit of multiplexer 508, all 32 bits, if desired, could be input to bit position 0, for example, of destination 510. This property would be useful, for example, if a single pin in a device under test needed to be fed a serial data stream.

Figure 6:
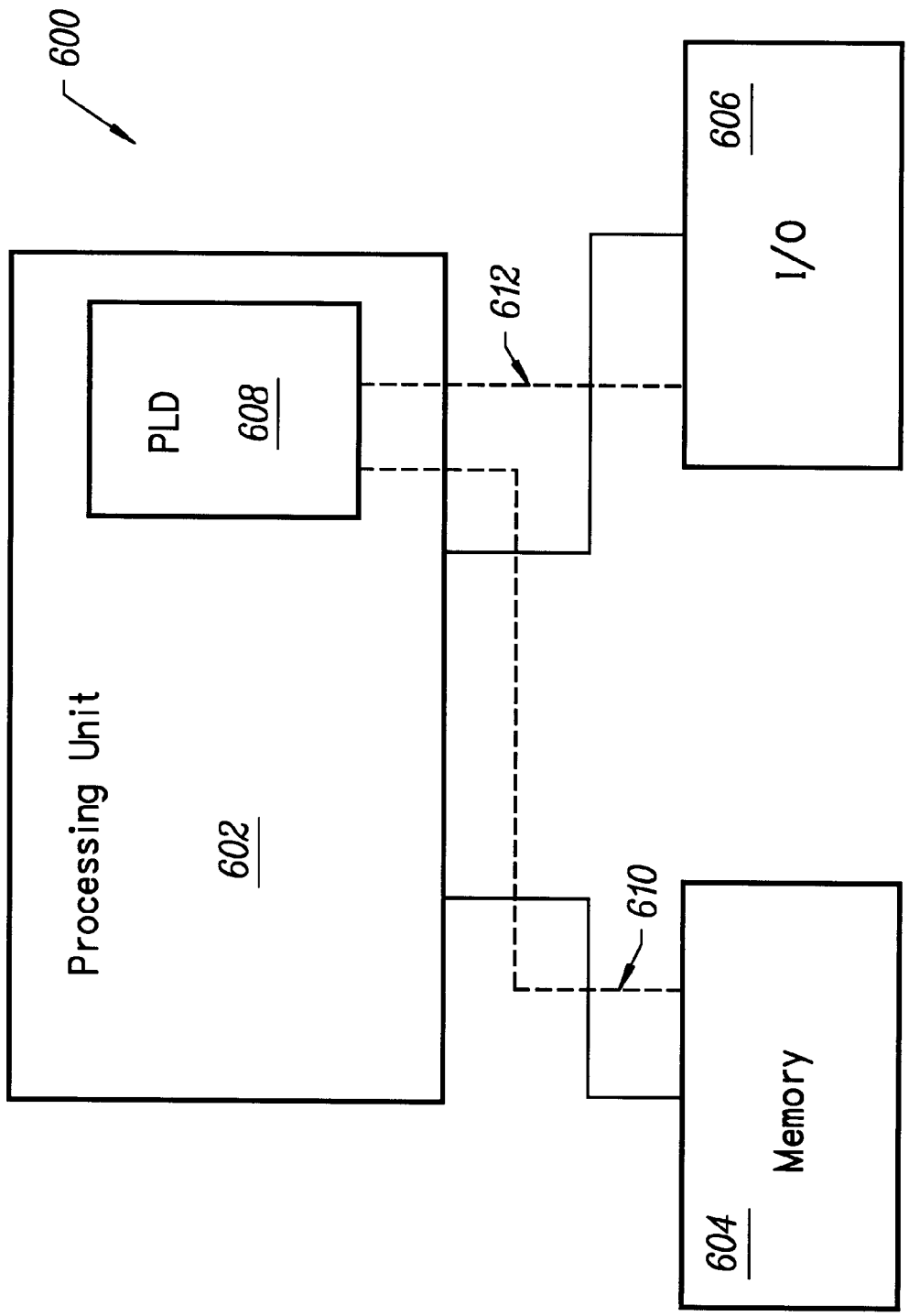
FIG. 6 shows a block diagram of a digital system in which a device tested by a preferred embodiment of the present invention may be embodied.

The purpose of carrying out tests on a semiconductor device is, of course, to verify that the manufacturing process yields an operable semiconductor device suitable for end-use circuit and system level designs. As an example, FIG. 6 shows a block diagram of a digital system 600 within which a device tested by the present invention may be embodied. In the particular embodiment of FIG. 6, a processing unit 602 is coupled to a memory 604 and an I/O 606 and incorporates a programmable logic device (PLD) 608. PLD 608 is manufactured with the method and apparatus disclosed above. PLD 608 may be specially coupled to memory 604 through connection 610 and to I/O 606 through connection 612. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 608, or a combination of a general purpose computer and auxiliary special purpose hardware.

Processing unit 602 may direct data to an appropriate system component for processing or storage, execute a program stored in memory 604 or input using I/O 606, or other similar function. Processing unit 602 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 608 may control the logical operations of the system.

In some embodiments, processing unit 602 may even be a computer system. In one embodiment, source code may be stored in memory 604, compiled into machine language, and executed by processing unit 602. Processing unit 602 need not contain a CPU and in one embodiment, instructions may be executed by one or more PLDs 608. Instead of storing source code in memory 604, only the machine language representation of the source code, without the source code, may be stored in memory 604 for execution by processing unit 602. Memory 604 may be a random access memory (RAM), read only memory (ROM), fixed or flexible disk media, PC Card flash disk memory, tape, or any other storage retrieval means, or any combination of these storage retrieval means.

Processing unit 602 uses I/O 606 to provide an input and output path for user interaction. For example, a user may input logical functions to be programmed into programmable logic device 608. I/O 606 may be a keyboard, mouse, track ball, digitizing tablet, text or graphical display, touch screen, pen tablet, printer, or other input or output means, or any combination of these means. In one embodiment, I/O 606 includes a printer used for printing a hard copy of any processing unit 602 output. In particular, using I/O 606, a user may print a copy of a document prepared using a word processing program executed using processing unit 602. In other cases, a user may print out a copy of the source code or a listing of the logical functions contained within PLD 608.

PLD may serve many different purposes within the system in FIG. 6. PLD 608 may be a logical building block of processing unit 602, supporting its internal and external operations. PLD 608 is programmed to implement the logical functions necessary to carry on its particular role in system operation.

As some examples of the multitude of uses for PLD 608, processing unit 602 may use PLD 608, through connection 610, to decode memory or port addresses for accessing memory 604 or I/O 606. PLD 608 may be programmed to store data like a memory or specialized memory, where this comes from processing unit 602 or memory 604 (via connection 610). PLD 608 may be used as a microcontroller for a memory 604 device such as a fixed or flexible disk drive. PLD 608 may also be configured to be a microcontroller for an I/O 606 device such as a keyboard or scanner, passing data through connection 612.

In other embodiments, PLD 608 may be used as a controller or specialized processing unit such as a coprocessor for performing mathematical or graphical calculations. In still other embodiments, PLD 608 may be used for telecommunications applications. For example, processing unit 602 would direct data to PLD 608; PLD 608 processes this data; then PLD 608 returns the results to processing unit 602. Furthermore, processing unit 602 may pass or direct a program stored in memory 604 or input using I/O 606 to PLD 608 for execution. These are some of multitude of uses of PLD 608 within a digital system. Also, a system such as the one shown in FIG. 6 may embody a plurality of PLDs 608, each performing different system functions.

The system shown in FIG. 6 may also be used for programming PLD 608 with a particular logic pattern. A computer program for designing functions into a PLD may be stored in memory 604 and executed using processing unit 602. Then, a design characteristic which is to be programmed into PLD 608 is input via I/O 606 and processed by processing unit 602. In the end, processing unit 602 transfers and programs the design characteristic into PLD 608.

In FIG. 6, processing unit 602 is shown incorporating PLD 608. However, in other embodiments, PLD 608 may be external to processing unit 602, and a PLD interface may be coupled between processing unit 602 and PLD 608. The PLD interface would provide the proper adapters or sockets for interfacing PLD 608 to processing unit 602. Moreover, the PLD interface would provide the proper voltages and electrical characteristics for coupling PLD 608 to processing unit 602.

The above description is illustrative and not restrictive. Many variations of the invention will become apparent to those of skill in the art upon review of this disclosure. For example, though the data transfer circuit of the present invention has been specifically described in conjunction with a semiconductor device test system, it will be clear to one skilled in the art that a data transfer circuit that maximizes the data transmission rate from a source data path to selected channels of a destination data path having a different width from the source data path will be useful in many different applications. The scope of the invention should, therefore, be determined not with reference to the above description, but instead should be determined with reference to the appended claims along with their full scope of equivalents.

What is claimed is:

1. A data transfer circuit comprising:
 a source containing source data to be transferred, said source configured to receive said source data from a source data path;
 at least one transfer register coupled to said source by a data bus, said transfer register receiving said source data in a single source data cycle;
 at least one multiplexer coupled to said transfer register, said multiplexer receiving said source data from said transfer register; and
 a destination coupled to said multiplexer, said destination receiving said source data from said multiplexer.

2. The data transfer circuit of claim 1 wherein said destination has a width different from said source.

3. The data transfer circuit of claim 1 wherein said transfer register has a width equal to said source.

4. The data transfer circuit of claim 1 wherein said multiplexer has a width equal to said source.

5. The data transfer circuit of claim 1 wherein said transfer register further comprises a shift register, said source data being shifted in said shift register for the purpose of transmitting said source data to selected bit positions in said destination.

6. The data transfer circuit of claim 1 wherein all bits of said source data are made available to each bit position in said destination.

7. The data transfer circuit of claim 1 wherein said multiplexer includes a plurality of n:1 multiplexers, wherein each of said plurality of n:1 multiplexers is configured to select a single bit of a plurality of bits in said source data, and output said selected bit to said destination.

8. The data transfer circuit of claim 1 wherein said transfer register includes a plurality of transfer registers, wherein each of said plurality of transfer registers is coupled to said multiplexer.

9. The data transfer circuit of claim 8 wherein said multiplexer includes a plurality of multiplexers, each of said plurality of multiplexers being coupled to one of said plurality of transfer registers, each of said plurality of multiplexers configured to select a single bit of said source data and output said selected bit to said destination.

10. The data transfer circuit of claim 8 wherein at least one of said plurality of transfer registers has a width equal to said source.

11. A configuration for testing an integrated circuit chip comprising:
   a control unit for controlling testing of said integrated circuit chip;
   a tester interface coupling said control unit to a test bus, said tester interface including a data transfer circuit for transferring source data from a source to a destination, said source configured to receive said source data from a source data path, said data transfer circuit comprising:
      at least one transfer register coupled to said source, said transfer register receiving said source data in a single source data cycle; and
      at least one multiplexer coupled to said transfer register, said multiplexer receiving said source data from said transfer register; and
   a tester card coupled to said test bus for holding said integrated circuit chip.

12. The configuration of claim 11 wherein said source is located in said control unit.

13. The configuration of claim 11 wherein said destination is located in said integrated circuit chip.

14. The configuration of claim 11 wherein said destination has a width different from said source.

15. The configuration of claim 11 wherein said transfer register has a width equal to said source.

16. The configuration of claim 11 wherein said multiplexer has a width equal to said source.

17. The configuration of claim 11 wherein said integrated circuit chip further comprises a programmable logic device.

18. The configuration of claim 11 wherein said transfer register further comprises a shift register, said source data being shifted in said shift register for the purpose of transmitting said source data to selected bit positions in said destination.

19. The configuration of claim 11 wherein all bits of said source data are made available to each bit position in said destination.

20. A data transfer circuit comprising:
   a source containing source data to be transferred, said source configured to receive said source data from a source data path;
   at least one transfer register coupled to said source by a data bus, said transfer register receiving said source data in a single source data cycle;
   at least one multiplexer coupled to said transfer register, said multiplexer receiving said source data from said transfer register; and
   a destination coupled to said multiplexer, said destination receiving said source data from said multiplexer,
   wherein said destination has a width different from said source.

21. A data transfer circuit comprising:
   a source containing an N-bit wide source data to be transferred;
   a plurality of N-bit wide transfer registers each coupled to said source via an N-bit wide bus;
   a plurality of N-to-1 multiplexers divided into a plurality of groups with each group having M N-to-1 multiplexers, where M is a positive integer, each group of M N-to-1 multiplexers being coupled to a respective one of said plurality of N-bit wide transfer registers; and
   a plurality of M-bit wide destinations each one respectively coupled to outputs of a respective one of said groups of M N-to-1 multiplexers.

22. The data transfer circuit of claim 21 wherein M equals N.

23. A data transfer circuit comprising:
   an N-bit transfer register receiving an N-bit wide source data at an input coupled to an N-bit wide bus, said N-bit transfer register having N outputs;
   a plurality of N-to-1 multiplexers each receiving said N outputs of said N-bit transfer register; and
   an N-bit destination having N inputs respectively coupled to an output of each of said plurality of N-to-1 multiplexers.

24. The data transfer circuit of claim 23 wherein said plurality of N-to-1 multiplexers comprises N multiplexers, and N is substantially equal to 32.

* * * * *